AMPLIFIER CIRCUITS EMPLOYING VARACTORS FOR CONTROLLING POWER GAIN BANDWIDTH

Original Filed Sept. 8, 1966

INVENTOR
JOSEPH E. RACY
BY [signature]
ATTORNEY

United States Patent Office 3,461,395
Patented Aug. 12, 1969

3,461,395

AMPLIFIER CIRCUITS EMPLOYING VARACTORS FOR CONTROLLING POWER GAIN AND BANDWIDTH

Joseph E. Racy, Nashua, N.H., assignor to Sanders Associates, Inc., Nashua, N.H., a corporation of Delaware Original application Sept. 8, 1966, Ser. No. 577,962, now Patent No. 3,384,835, dated May 21, 1968. Divided and this application Sept. 11, 1967, Ser. No. 683,748
Int. Cl. H03g 3/30, 3/20, 5/00
U.S. Cl. 330—29 6 Claims

ABSTRACT OF THE DISCLOSURE

The present invention pertains to electronic circuits, and more particularly to amplifier circuits including an electronic valving device and employing varactors for the purpose of controlling the power gain, bandwidth or effective output impedance characteristics thereof. The varactor is employed in an amplifier circuit which also includes a tuned circuit and a source of control signals. The control signals are fed to the varactor and are able to cause the varactor to vary the Q of the tuned circuit, to thereby vary the bandwidth or the power gain of the amplifier. The control signals fed to the varactor are also effective to cause the varactor to vary the effective output impedance of the electronic valving device.

This invention relates to the use of varactors to control the amplitude of and/or frequency characteristics of electronic amplifier circuits.

The present application is a division of my presently pending application Ser. No. 577,962, filed Sept. 8, 1966 and now Patent No. 3,384,835 and entitled "Amplitude and Frequency Servo Control."

In one embodiment of the invention, such as amplifier circuit is provided with feedback from the load and operates as an oscillator. The varactor is so arranged in the circuit that a relatively small control signal can selectively gate the oscillator on and off, and, alternatively, vary either the amplitude or the frequency of the oscillator output signal, or both of them.

In another embodiment, the varactor is arranged in series between the amplifier circuit and the tuned load to provide electronic control of the circuit gain and bandwidth. This configuration is well suited for use in radio receivers and transmitters.

An object of the invention is to provide improved amplitude and frequency control for amplifier circuits operating with tuned loads. Another object is to provide relatively simple configurations for multiple purpose electronically controllable tuned amplifier circuits.

A more specific object of the invention is to provide an oscillator characterized by relatively low-level varactor gating of the output signal and, alternatively, control of the amplitude and frequency of the output signal.

A further object of the invention is to provide an electrical source of frequency modulated and/or amplitude modulated signals characterized by fast response to the modulating signal. Still another object of the invention is to provide such an electrical source capable of varying the output frequency and/or amplitude over a relatively wide range.

A further object of the invention is to provide improved feedback control for an electronic oscillator.

It is also an object of the invention to provide a tuned amplifier having improved electronic control of the bandwidth and gain characteristics.

Other objects of the invention will in part be obvious and will in part appear hereinafter.

The invention accordingly comprises the features of construction, combinations of elements, and arrangements of parts exemplified in the constructions hereinafter set forth, and the scope of the invention will be indicated in the claims.

Figure 2:
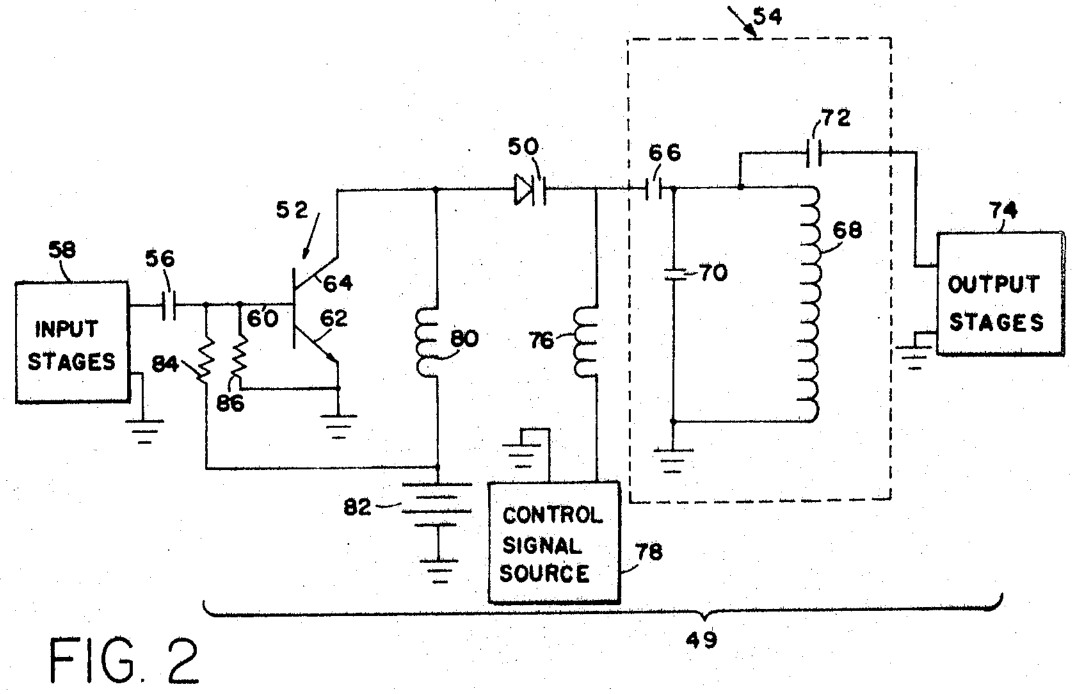
Figure 1:
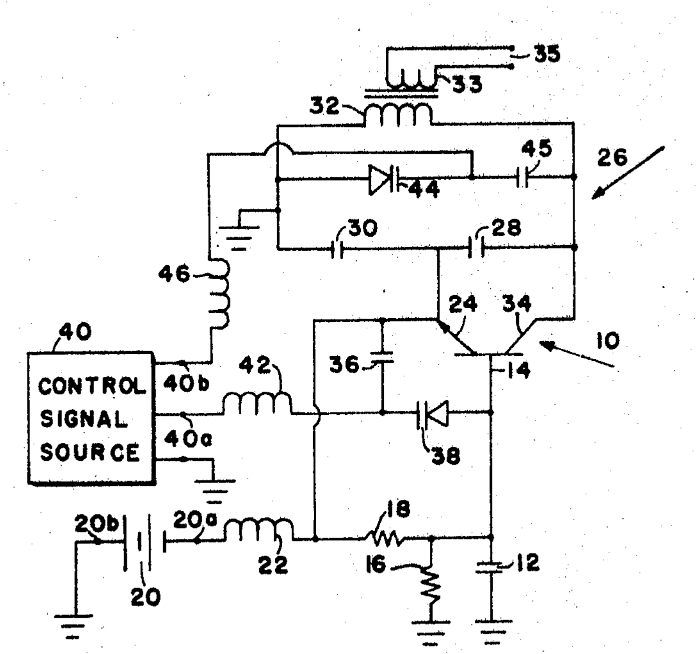

For a fuller understanding of the nature and objects of the invention, reference should be had to the following detailed description taken in connection with the accompanying drawings, in which:

FIG. 1 is a schematic diagram of an electronically controllable oscillator embodying the invention; and FIG. 2 is a schematic diagram of a tuned amplifier in which the gain and/or bandwidth are electronically controllable.

In the illustrated oscillator, a varactor is in parallel with the element producing the feedback signal that sustains the oscillations. Changing the capacitance of the varactor with a control signal changes the amplitude of the feedback signal sufficiently to interrupt the oscillations. Thus, the varactor provide a means for not only controlling the output amplitude of the periodic signal from the oscillator, but also for gating the oscillator on and off, both with a relatively small control signal as compared with many prior varactor circuits.

The varactor is also part of the resonant circuit in which the oscillations are developed. Hence, changing the varactor capacitance changes the oscillator output frequency. a second varactor can be incorporated in the circuit in a compensating arrangement whereby the amplitude of the oscillations can be modulated while the frequency is held uniform and, alternatively, the frequency can be modulated and the amplitude held uniform.

The invention also provides a tuned amplifier in which a varactor couples an amplifying transistor to the tuned output circuit in such a manner as to provide control of both the gain and bandwidth of the amplifier.

More particularly, as shown in FIG. 1, the illustrated oscillator has a transistor 10 in a common base arrangement. A bypass capacitor 12 is connected to ground from the transistor base 14. The base is also connected to the interconnection of resistors 16 and 18 that form a voltage divider between the negative terminal 20*a* of a supply battery 20 and ground. A choke 22 is in series between the terminal 20*a* and the voltage divider to isolate oscillating signals from the battery. The negative voltage from the battery is also applied, through the choke 22, to the transistor emitter 24, and the battery positive terminal 20*b* is grounded.

As also shown in FIG. 1, a tuned circuit indicated generally at 26 and comprising a capacitor 28 in parallel with the series combination of a capacitor 30 and an inductor 32 is connected between the transistor collector 34 and emitter 24. The interconnection of the capacitor 30 and the inductor 32 is connected to ground. An output winding 33 is inductively coupled with the inductor 32 and develops the oscillator output signal between terminals 35 in response to resonant currents in the tuned circuit.

A varactor 38 is in series with a blocking capacitor 36 between the transistor base 14 and the emitter 24. A choke 42, connected between a terminal 40*a* on a grounded control signal source 40 and the interconnection of the capacitor 36 and varactor 38, applies a control signal to the varactor. The control signal back biases the varactor 38 and hence it appears electrically as a capacitor, the value of which increases with the value of the back-biasing voltage. The control signal is a direct voltage or a changing voltage the frequency of which is considerably below the minimum resonant frequency of the tuned circuit 26. The capacitor 36 blocks the control signal from the transistor emitter 24.

The resonant circuit 26 is arranged according to conventional techniques so that the current through the capacitor 30 develops a voltage that appears at the transistor input, i.e., between the base 14 and emitter 24, with the proper phase for regenerative action. Further, because the capacitors 36 and 12 have negligible impedances at the frequency of oscillation, the varactor 38 is in parallel with the capacitor 30 between the emitter and base of the transistor.

As a result, the feedback ratio of the oscillator is determined by the ratio of C28 to the parallel combination of C30 and C38, that is, by the ratio of the capacitance of capacitor 28 to the parallel capacitance of the capacitor 30 and varactor 38. Also, the capacitance of the vacator 38 affects the resonant frequency of the tuned circuit 26. Accordingly, when the control signal from the generator 40 changes the capacitance of the varactor 38, both the feedback ratio and the resonant frequency of the tuned circuit 26, change. Hence, both the amplitude and the frequency of the oscillating signal in the circuit 26, and at the output terminals 35, change.

For example, when the control signal at terminal 40 increases so that the capacitance of the varactor increases, the resonant frequency of the tuned circuit 26, and correspondingly of the oscillator output signal, increases. Also, the amplitude of the feedback voltage, across the varactor, decreases. This brings about a reduction in the amplitude of the oscillating current in the tuned circuit 26, and of the oscillator output signal.

When the increase in varactor capacitance is made sufficiently large, the feedback signal drops to such an extent that the circuit stops oscillating. The signal at the output terminals 35 then drops to zero. The control source 40 can thus modulate the frequency and the amplitude of the output signal, and the amplitude modulation can be sufficient to gate the output signal on and off. The value of the varactor capacitance relative to the capacitance of the capacitor 30 determines the effectiveness of changes in the varactor capacitance, and hence of changes in the control signal, on the amplitude and output frequency of the oscillator.

As will now be described with further reference to FIG. 1, a second varactor 44 can be connected in the tuned circuit 26 to enable either the output amplitude or frequency to be modulated while maintaining the other characteristic of the output signal fairly uniform. The varactor 44 is connected, through a blocking capacitor 45, in parallel with the inductor 32 and is connected by means of a choke 46 to a terminal 40*b* on the control source 40. The source maintains this terminal positive to back bias the varactor 44 so that it too operates as a variable capacitor.

An increase in the capacitance of the varactor 44 increases the resonant frequency of the tuned circuit 26. However, the capacitance of the varactor 44 also affects the amplitude of the feedback voltage across the varactor 38. That is, increasing the capacitance of varactor 44 will result in a larger feedback signal and hence in stronger oscillations. Thus, both the resonant frequency and the amplitude of the tuned circuit oscillations vary in the same direction as the capacitance of varactor 44. However, only the frequency varies in the same direction as the capacitance of varator 38, for the amplitude varies in the opposite direction.

As a result, when the control source 40 applies to the two varactors 38 and 44 control signals that increase and decrease in phase with each other, the changes in the amplitude of the resonating currents in the tuned circuit can be made to cancel each other so that only the resonant frequency changes. Conversely, when the two varactors are "tuned" at the same rate in opposite directions, the frequency variations are in opposite directions and can be cancelled so that only the amplitude of the resonating current changes.

Further, at intermediate conditions, the circuit can produce a change in output frequency and a change in output amplitude, with the rate of change of each characteristic having substantially any desired value. The values of the capacitances of the varactors relative to the other reactances in the circuit, and the relative amplitudes of the control signal applied to the varactors required to attain each of these modes of operation can readily be calculated according to known principles.

It will thus be seen that the circuit of FIG. 1 can produce an output signal having a variety of amplitude and frequency characteristics. Many of the different possible signals can be obtained merely by adjusting only the characteristics of the control source 40.

FIG. 2 shows a tuned amplifier stage 49 in which the capacitance of a varactor 50 couples a common emitter transistor 52 to a tuned load circuit indicated generally at 54. More particularly, the illustrated amplifier stage has a capacitor 56 coupling the output signal of input stages 58 to the base 60 and the grounded emitter 62 of the transistor 52. The transistor collector 64 is connected to one terminal of the varactor 50, the other terminal of which is connected to a blocking capacitor 66 in series in the load circuit 54. The latter includes the resonant parallel combination of an inductor 68 and a capacitor 70. The output signal from the amplifier is coupled from the load circuit 54 to output stages 74 by a coupling capacitor 72 connected to the interconnection of the load circuit elements 66, 68 and 70 as shown or, alternatively, with an inductor coupled with the inductor 68.

As also shown in FIG. 2, a choke 76 applies the output signal from a control signal source 78 to the interconnection of the varactor 50 and the load circuit 54 to control the capacitance of the varactor. The control signal returns to the grounded source terminal through a choke 80, and a battery 82 that provides the bias and operating voltages for the transistor. As with the oscillator circuit of FIG. 1, the frequency of the control signal from the generator 78 is considerably lower than the resonant frequency of the load circuit 54.

The inductor 80 also applies positive voltage from the battery 82 to the transistor collector, and a voltage divider formed by resistors 84 and 86 applies a smaller positive voltage to the base 60. The negative battery terminal is grounded.

With further reference to FIG. 2, in the illustrated amplifier stage 49, the value of the varactor 50 capacitance determines the impedance the transistor presents to the tuned circuit. This makes it possible for the transistor to have a relatively low output impedance and still be matched to a tuned circuit that has a relatively high resonant impedance.

Further, the quality factor, Q, of the tuned circuit decreases as the impedance the varactor presents to it decreases. And the bandwidth of the amplifier stage is inversely related to the Q of the tuned circuit. Accordingly, changing the capacitance of the varactor 50 by changing the amplitude of the control signal provides an efficient means of controlling the bandwidth of the amplifier stage.

For example, a decrease in the control voltage decreases the varactor capacitance. Accordingly, the varactor presents a larger impedance to the tuned circuit, with the result that the tuned circuit Q increases and the bandwidth of the overall amplifier stage becomes narrower.

This electronic control of the amplifier stage can advantageously be employed in a radio receiver to adjust the receiver bandwidth. In this instance, the input stages 58 would typically comprise the R.F. and mixer portion of the receiver, the amplifier stage 49 would be an I.F. amplifier, and the output stages 74 include the demodulator and other subsequent portions of the receiver.

Alternatively, when the circuit of FIG. 2 is part of a transmitter, the control signal source 78 can be used to adjust the power gain of the amplifier stage. This is because the power gain corresponds to the Q of the tuned circuit 54. When the amplifier stage 49 is used in this manner, the input stages 58 include the carrier-frequency oscillator and the circuit for modulating the information signal to be transmitted, and the power amplifiers would typically be included in the output stages 74.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

Having described the invention, what is claimed as new and secured by Letters Patent is:

1. An electronically tunable circuit comprising:

(A) a transistor having an emitter, a collector and a base and arranged to develop between said collector and emitter an amplified output signal responsive to a signal impressed between said base and said emitter, (B) a tuned circuit, (C) output means coupling an amplified signal from said tuned circuit, (D) a varactor, (E) means coupling said varactor in series between said collector and said tuned circuit and applying the impedance of said varactor in series between the impedance of said tuned circuit and the output impedance of said transistor, (F) control means arranged to develop a varactor control signal for selectively back-biasing said varactor, and variations in said control signal causing variations in said impedance of said varactor, to thereby change the bandwidth of said tuned circuit, and (G) isolating means arranged to isolate the signal developed by said control means from said tuned circuit and from said transistor.

2. A circuit according to claim 1 in which (A) said coupling means comprises a blocking capacitor in series between said varactor and said tuned circuit and (B) said varactor is connected between the collector of said transistor and said blocking capacitor.

3. A circuit according to claim 1 wherein said isolating means comprises first and second chokes, said first choke being connected between one terminal of said varactor and said control means, said second choke being connected between said collector and a bias source.

4. An electronic circuit comprising:

(A) a transistor having an emitter, a base and a collector, (B) a common terminal, (C) a coupling capacitor having one terminal connected to said base, (D) an input stage having output terminals connected to the other terminal of said coupling capacitor and said common terminal, (E) a direct voltage supply having a first terminal connected to said common terminal and having a second terminal, (F) first and second resistors in series with each other between said second terminal of said direct voltage supply and said common terminal, the interconnection of said first and second resistors being connected to said base, (G) a tuned circuit comprising a capacitor in parallel with an inductor, (H) a varactor, (I) a blocking capacitor in series with said varactor between said transistor collector and one interconnection of said tuned circuit capacitor and inductor, with said varactor being intermediate said blocking capacitor and said collector, (J) a first choke connected between said second terminal of said direct voltage supply and said transistor collector, (K) a varactor control source having one terminal connected to said common terminal, (L) a second choke connected between a further terminal on said control source and the interconnection of said varactor and said blocking capacitor, (M) an output stage, and (N) means for coupling resonating currents from said tuned circuit to said output stage.

5. A tuned amplifier circuit comprising:

(A) a transistor having an emitter, a base, and a collector and arranged to develop between the collector and emitter an amplified signal responsive to a signal impressed between the base and emitter, (B) a parallel resonant circuit connected with the transistor and receiving said output signal from the collector thereof, (C) a varactor in the circuit between said transistor and said resonant circuit, (D) the impedance of the varactor being applied in series between the output impedance of said transistor and the impedance of said resonant circuit, (E) a control source arranged to apply a control signal to said varactor, and variations in said control signal causing a variation in the impedance of said varactor, to thereby change the quality factor, Q, of said amplifier circuit, (F) isolating means arranged to isolate said control signal from said transistor and from said resonant circuit, and (G) output means arranged to couple from the resonant circuit a signal at its resonant frequency.

6. An electronically tunable circuit comprising:

(A) an electronic valving device (1) having first, second and third terminals, and (2) arranged to develop an amplified output signal between said first and third terminals in response to a signal impressed between said first and second terminals, (B) a tuned circuit, (C) output means coupling an amplified signal from said tuned circuit, (D) a varactor, (E) means coupling said varactor in series between said third terminal and said tuned circuit and applying the impedance of said varactor in series between the impedance of said tuned circuit and the output impedance of said electronic valving device, (F) control means arranged to develop a varactor control signal for selectively back-biasing said varactor, and (G) isolating means arranged to isolate the signal developed by said control means from said tuned circuit and from said electronic valving device.

References Cited

UNITED STATES PATENTS

| | | | |
|---|---|---|---|
| 2,243,423 | 5/1941 | Hollingsworth | 330—145 X |
| 2,735,902 | 2/1956 | Vose | 330—145 |
| 3,068,427 | 12/1962 | Weinberg | 332—30 |
| 3,151,302 | 9/1964 | Hyman | 330—145 |

OTHER REFERENCES

"Voltage-Tuned Amplifier Uses New TI Variable Capacitance Diodes," Electronic Design, Jan. 20, 1964, p. 27.

ROY LAKE, Primary Examiner

JAMES B. MULLINS, Assistant Examiner

U.S. Cl. X.R.

330—31, 145